United States Patent [19]
Bunge

[11] 4,084,245
[45] Apr. 11, 1978

[54] ARRANGEMENT FOR STATISTICAL SIGNAL ANALYSIS

[75] Inventor: Ernst Bunge, Hamburg, Germany

[73] Assignee: U.S. Philips Corporation, New York, N.Y.

[21] Appl. No.: 714,103

[22] Filed: Aug. 13, 1976

[30] Foreign Application Priority Data

Aug. 16, 1975 Germany ............... 2536585

[51] Int. Cl.² ............................................. G10L 1/04
[52] U.S. Cl. ................... 364/485; 179/1 SB;
324/77 B; 364/554; 364/572
[58] Field of Search ............... 235/151.31, 151.3, 181;
179/1 SA, 1 SB, 1 SD, 1 SM; 324/77 R, 77 A, 77 B; 340/149 R

[56] References Cited
U.S. PATENT DOCUMENTS

| | | | |
|---|---|---|---|
| 3,466,394 | 9/1969 | French ............... | 179/1 SB |
| 3,484,746 | 12/1969 | Fralick et al. ............... | 324/77 B X |
| 3,509,280 | 4/1970 | Jones ............... | 324/77 R |
| 3,673,331 | 6/1972 | Hair et al. ............... | 179/1 SB |
| 3,909,533 | 9/1975 | Willimann ............... | 179/1 SA |
| 3,919,479 | 11/1975 | Moon et al. ............... | 179/1 SB |

*Primary Examiner*—Joseph F. Ruggiero
*Attorney, Agent, or Firm*—Frank R. Trifari; Steven R. Biren

[57] ABSTRACT

An arrangement for signal analysis in which the function to be examined is split into its spectral components in a filter bank. The signal values of the individual components are successively applied to a comparison device and to the input of a store. The output of the store feeds the other input of the comparison device which generates a signal whenever the instantaneous signal values of all spectral components correspond to the stored, corresponding signal values, within predetermined tolerance limits. The successful comparison of each time a pair of signal values is counted for all spectral components, and the output signal is generated only if a predetermined counter position is reached. As a result, complete correspondence is not required. An additional pulse generator can also generate pulses for given spectral components which correspond to a successful comparison. The directly successive pulses of the comparison device are counted, and in the case of a negative overall comparison this counter position is transferred to a histogram-forming device which separately counts the numbers of the various counter positions.

11 Claims, 2 Drawing Figures

ARRANGEMENT FOR STATISTICAL SIGNAL ANALYSIS

The invention relates to an arrangement for statistical signal analysis by the determination of the frequency distribution of occurring lengths or durations of the stationary condition of a varying amplitude/time function of an input signal with a number of spectral components.

A frequency distribution of this kind represents a new possibility of statistically describing sound sources, notably for the characteristic description of speech signals, for automatic speaker recognition or speech recognition. It is particularly suitable for describing the speaking habits of speakers for the purpose of speaker verification and speaker identification. The particular advantage of a statistical analysis is embodied in the fact that it can be realized independently of the effects of preceding transmission functions, for example, imposed by different telephone connections, which give frequency dependent attenuations.

It is an object of the invention to provide a simple arrangement of the kind set forth. It is an object of the invention to provide an arrangement for the extraction of characteristic properties from a sound signal independent of distortions in the signal by frequency dependent attenuations, and whereby line-induced irregularities are to a great extent ignored. It is an object of the invention to provide such an arrangement to be used in speaker recognition or in the analysis of industrially produced sounds, such as rotary electric engines, ignition engines or power turbines. The objects of the invention are realized in that it is characterized in that a filter bank (1) is adapted for receiving said amplitude/time function and for separately generating the time (T) dependent signal values S ($i$,T) for the respective individual components ($i$) of said function, whereby a comparison device (10) is provided having an input connected to an output of said filter bank and being adapted for comparing each time the instantaneous signal value (S($i$, T1)) of each spectral component ($i$) with the signal value (S($i$, T2)) of the same spectral component having occurred a given period of time earlier and stored in a store (6) of which an information input is connected to an output of said filter bank, the said comparison device being adapted for supplying an output signal if the instantaneous signal value of at least a predetermined fraction of the spectral components deviates from the corresponding stored signal value by less than a predetermined tolerance range ($fo$, $fu$), said store being adapted for generating a predetermined delay between the reception of a signal value at its input and the reproduction of the same signal value at its output which is connected to an input of the comparison device, a first counter (8) being provided for counting the directly successive signals of the comparison device, while after the comparison the absence of a signal from the comparison device causes the transfer of the counting position of the first counter to a histogram-forming device (9) which is adapted for receiving said counter position and for separately counting the number of the transfers of each separate counter position of the first counter, and whereby said first counter is adapted for being reset to a starting position after each transfer.

In many cases, notably in the case of speech analysis, the spectral components are situated in a comparatively low-frequency range which is far below the clock frequency of contemporary digital circuit elements, so that the comparator is preferably constructed for the comparison of the signal values of each time only a single spectral component, the signal values of a complete set of spectral components being successively compared and a second counter counting the number of correct comparisons. The complexity can thus be further reduced.

Preferred embodiments of the arrangement in accordance with the invention will be described in detail hereinafter with reference to the drawings.

Figure 1:
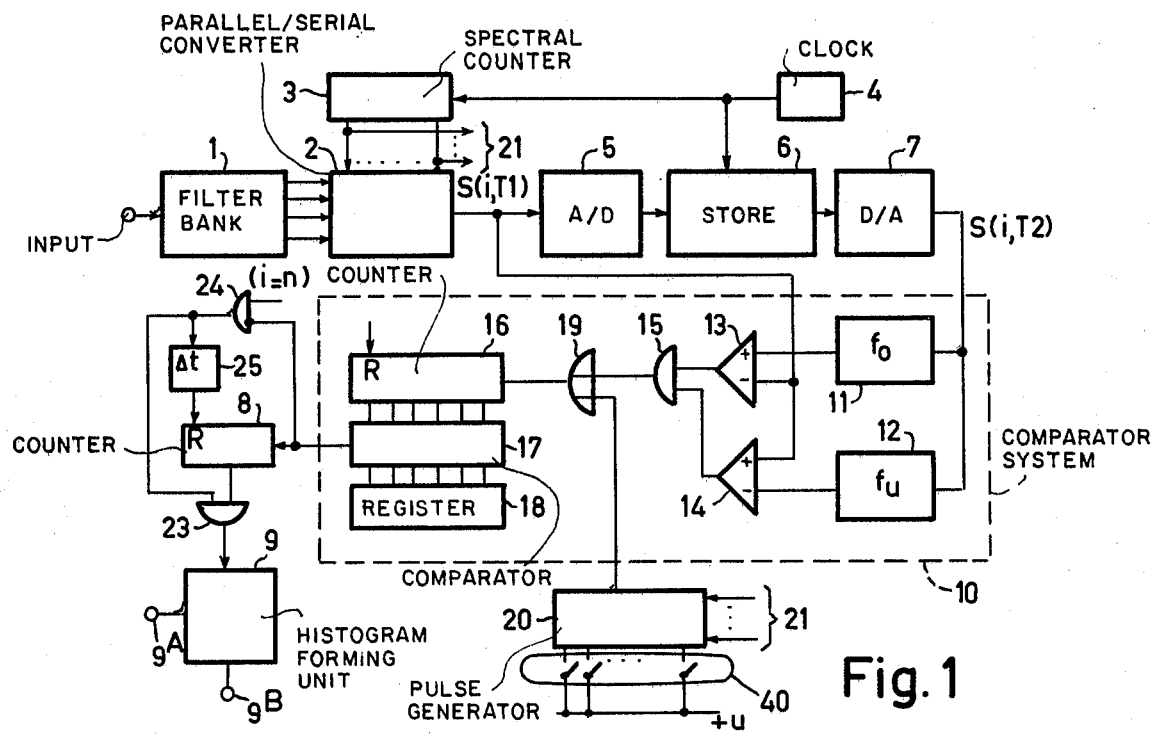
FIG. 1 shows a block diagram of a complete arrangement.

The signal to be examined, in the form of a varying amplitude/time function with a number of spectral components, is applied to a filter bank 1 which produces the spectral components of this signal separately on a plurality of parallel outputs which have been indicated by arrows. The respective filters, for example in the form of ringing circuits are of conventional construction and have not been indicated for simplicity. The outputs of filter bank 1 are connected to respective signal inputs of a parallel-to-series converter 2. The latter each time selects a single signal input and connects this input to the output. To this end, the parallel-to-series converter 2 is controlled by a spectral component counter 3, via the control lines 21, so that the instantaneous signal values S($i$, T1) of the individual spectral components $i$ at instant T1 appear on the output of the parallel-to-series converter 2 under control of the control signal sequence on lines 21. Commercially available multiplexers in the form of integrated circuit elements can be used for the series/parallel converter.

The spectral component counter 3 obtains its counting clock pulses from a clock pulse generator 4 whose clock pulse frequency is adjusted to a predetermined value so that the counter 3 completes a complete counting cycle in a period of time which equals the distance in the time between the two signal values of the same spectral component to be compared. This distance in time must be determined in relation to the signal to be examined and preferably amounts to a few milliseconds for human speech signals. For other signal types other cycle times, be it higher or lower, are applicable. The counter positions of the counter 3, each of which is associated with a given spectral component, are transmitted in coded form, via the lines 21, to the parallel/series converter 2 and also to further circuits which will be described hereinafter.

The instantaneous signal value S($i$, T1) is applied to an analog-to-digital converter 5 which converts this analog signal value into a digital signal which is applied to the information input of storage means 6. This store is a shift register which is controlled for shifting by the clock pulse signal of clock pulse generator 4. The digital information signal produced by the analog-to-digital converter 5 is a word consisting of a predetermined number of parallel bits, and each of the successive stages of the shift register 6 consists of as many parallel storage elements. If the number of stages of the shift register equals the capacity of the counter 3, a signal value written into the shift register 6 at a given instant will be exactly at the end of the shift register after a complete cycle of the counter 3, this signal value being shifted out of the register under the influence of the next clock pulse of the clock pulse generator 4, the next signal value of the same spectral component being input at the same time at the information input of shift register 6. In certain cases analog-to-digital converter 5 would need further clock pulse control but this has not been shown in the figure as analog-to-digital converters are commercially available.

The output of shift register 6 is connected to the information input of a digital-to-analog converter 7 which again converts the digital signal into the analog signal which represents the stored signal value $S(i, T2)$. The network formed by the analog-to-digital converter 5, the digital shift register 6 and the digital-to-analog converter 7 serves for the intermediate storage of the signal values of a complete set of spectral components for the comparison process. This storage, however, can also be realized in a purely analog form by the use of bucket brigades or CCD stores, in which case the converters 5 and 7 can be dispensed with. Also in that case, the length of the store 6 and the shifting speed must be synchronized with the cycle time of the counter 3.

The input of the comparator 10 then carries the instantaneous signal value $S(i, T1)$ and the previously stored signal value $S(i, T2)$ of the same spectral component on instant T2. Here, the difference between the values T1 and T2 corresponds to the cycle time of counter 3. Successively, the signal value pairs of all spectral components successively appear. The instantaneous signal value $S(i, T1)$ is then applied to first inputs of two operational amplifiers 13 and 14 which are connected as comparators, the said instantaneous signal value being compared therein with the stored signal value which has been multiplied in the multipliers 11 and 12 by a factor corresponding to the upper tolerance limit $fo$ and the lower tolerance limit $fu$, respectively.

In order to clarify the function of this part of the comparison device 10, it is assumed by way of example that it must be established whether the instantaneous signal values do not deviate more than 10% from the corresponding previously stored signal values. The signal value $S(i, T2)$, stored in the multiplier 11, is then multiplied by the factor 1.1, which can be achieved, for example, by means of an amplifier having a corresponding gain adjusted by way of a feedback using resistor. The amplifier can also be contained in the digital-to-analog converter 7. Alternatively, only a fraction of the instantaneous signal value is applied, for example, via a fixed voltage divider, from series to parallel converter 2 to the comparator 10, so that in that case the multiplier 11 is only a voltage divider. The increased signal $fo \times S(i, T2)$ is applied to the non-inverting input of the operational amplifier 13, while the instantaneous signal value $S(i, T1)$ is applied to the inverting input. As long as the instantaneous signal value is smaller than the enlarged stored signal value, the operational amplifier 13 thus produces a positive output signal. When the instantaneous signal value becomes too high, i.e., within one cycle time of counter 3 the signal value has increased by more than 10%, said positive output signal does not appear. Similarly, the multiplier 12 reduces in this example the stored signal value $S(i, T2)$ by the factor 0.9, which can in this case be realized simply by means of a voltage divider of a corresponding value. This reduced signal value is applied to the inverting input of the operational amplifier 14, the non-inverting input of which receives the instantaneous signal value $S(i, T1)$. Thus, when the instantaneous signal value exceeds the reduced stored signal value, the operational amplifier 14 produces a positive output signal. When the instantaneous signal becomes too low, i.e., within one cycle time of counter 3 the signal value has decreased by more than 10%, said positive output signal does not appear.

The two outputs of the operational amplifiers 13 and 14 are connected to an AND-element 15 which generates an output signal if both operational amplifiers simultaneously produce a positive signal; this is the case only if the instantaneous signal value lies between the increased signal value and the reduced signal value, i.e., within the given tolerance range of ± 10% in this example. In certain cases unit 10 may be synchronized by a further clock signal, for example to a third input of AND-gate 15, but this has not been indicated further.

The output signal of AND-element 15 applied to the counting input of a counter 16 via the OR-element 19, the function of which will be described hereinafter. This counter is advanced one position in reaction to each positive comparison of the signal values of a spectral component $S(i, T1)$, $foS(i, T2)$, $fuS(i, T2)$. If this counter is each time reset to zero, via the input R, at the beginning of a set of spectral components $i$, i.e., before or at the beginning of the spectral component $i = 1$ the position of the counter 16 indicates for how many components within a set a positive comparison has already taken place. For effecting this a pulse can be derived from the corresponding counting position of the spectral counter 3, directly, or by means of a decoder not shown.

The outputs of the counter 16 are connected to a comparator 17 which compares the signals on these outputs, and hence the counter position, with a counter position given by the register unit 18. When the position of the counter 16 equals or exceeds the stored counter position in register 18, the comparator 17 produces an output signal which represents the output of the comparison device 10 and which is applied to the counting input of a counter 8. This counter has a differentiating counting input and therefore counts up by at most one during each cycle of counter 3. Thus in counter 8 the successive positive comparisons of the signal pairs for each time a complete set of spectral components are counted, i.e., the positive comparisons of two successive time periods of the amplitude/time function to be examined. A signal on the output of the comparison device 10 thus indicates that this amplitude/time function has remained the same within given limits during a given period of time.

In the case of a strict comparison of two successive values of the function to be examined, all signal value pairs $S(i, T1)$ and $S(i, T2)$ must correspond within the given tolerances. In this case the counter 17 must count to a position which corresponds to the capacity of the spectral component counter 3 and hence to the total number of spectral components, so that the device 18 must supply a corresponding signal combination to the comparator 17. For many functions to be examined, notably in the case of human speech signals, a signal condition can still be considered stationary for analysis purposes if at least for a predetermined fraction of the spectral components the signal value pairs $S(i, T1)$, $S(i, T2)$ correspond within the respective tolerance limits, while for at most a given number of spectral components a larger deviation may occur. This case can be taken into account by causing the device 18 to produce a signal combination, for example, by way of manually adjustable switches, which signal combination corresponds to this minimum number of spectral components yielding a positive comparison result. If a large number of positive comparisons occurs within a set of spectral components, the comparator 17 supplies a signal already before the comparison of the signal values of the last spectral component; this signal then advances the counter 8 by one position.

An other or additional possibility of generating a signal on the output of the comparison device 10 in the case of incomplete correspondence for all spectral components, is offered by the pulse generator 20. This pulse generator receives the control output signals of spectral component counter 3 as address signals. Each of these respective addresses connects a respective one of the connections leading to switches 40, to the output of pulse generator 20, which output is connected to an input of OR-gate element 19. The switches 40 are selectively closed or open, but when a switch is closed upon addressing the said switch the voltage U is connected to the output of pulse generator 20. Thus, for the associated spectral component the said signal is applied to the counting input of the counter 16, so that the latter is advanced by one position, regardless of the actual comparison result. Thus, exactly defined spectral components are substantially excluded from the comparison, while when the device 18 is correspondingly adjusted, only a given number of arbitrary spectral components is excluded or not taken into account. The pulse generator 20 can also be constructed as a fixed value store which can also contain one or a plurality of bit samples for a complete address set, one of the said bit samples being each time effective by additional control signals not shown. Each bit sample is operative in the same way as a configuration of open and closed switches 40, respectively, causing a selective sequence of ones and zeroes to appear on the output during a counting sequence of counter 3.

The counter 8 serves to count the number of directly successive correspondences of the amplitude/time function to be examined. If no satisfactory correspondence is found once during the comparison of the signal values of a complete set of spectral components, so that the comparator 17 does not generate a D.C. output signal, the counting position of the counter 8 reached thus far must be taken up in a digital histogram-forming device 9 and the counter 8 must subsequently be reset. The histogram-forming device 9 comprises a separate counter for each feasible or anticipated position of the counter 8, the said counter in element 9 being advanced one position when the associated counting position of the counter 8 is taken over.

This take-over is effected by means of the element 23 which is shown as an AND-element and which actually consists of a plurality of AND-elements, one for each of the parallel position outputs of the counter 8 which AND-elements are controlled in common by an output signal of the AND-element 24. This AND-element 24 generates a signal if for the last spectral component = $n$, i.e., in the corresponding position of the counter 3 or at the end thereof, no output signal of the comparison device 10 is present, as is indicated by the inversion on the corresponding input of the AND-element 24. If the comparator 17 supplies a signal only when the position of counter 16 corresponds exactly to the information of the device 18, the comparator 17 or the comparison device 10 can be followed by a simple collection store, or the output signal of the comparator 17 can prevent the further counting of the counter 16 and allows only resetting. The delay member 25 ensures that the counter 8 is reset only after its position has been taken over by the histogram-forming device.

In the foregoing description, a fixed tolerance value, adjusted by resistors, has been assumed for the multiplication factors of the multipliers 11 and 12. However, for many signals it is effective to compare the individual spectral components with different tolerance ranges, so that the multiplication factor, or the resistor whereby this factor is adjusted, should be adjustable in dependence of the respective spectral component. This can be achieved by means of the arrangement shown in FIG. 2. This arrangement comprises a plug connector panel 31 consisting of two sets 32 and 33/34 of mutually crossing conductors, it being possible to interconnect the two conductors crossing at each crossing by a plug. For the purpose of uncoupling, diodes must be provided which can be accommodated, for example, in the plugs. These diodes always have an electrode of like polarity to the relevant conductor of conductors 32. These conductors 32 receive signals from a decoder 30 which decodes the conductors 21 originating from the spectral component counter 3 of FIG. 1, so that each conductor 32 is permanently associated with a respective spectral component $i$ and a signal appears on this conductor at the instant where the signal values of this spectral component are being compared.

The set 33 of conductors is connected to a switching arrangement 35 which switches on or activates a given resistor of resistors 37, in accordance with conductor on which a signal appears, the said resistor determining the gain or voltage division in the multiplier 11 and hence the upper tolerance range for the comparison. Similarly, the set 34 of conductors is connected to a switching arrangement 36 which determines the voltage division in the multiplier 12 and hence the lower tolerance range by selective activation of one of the resistors 38. To this end, a conductor of the set 32 is each time connected to a conductor of the set 33 and also to a conductor of the set 34 by means of plugs, as indicated by dots at given crossings; the upper and the lower tolerance range may be different. In the embodiment shown, one conductor of the set 32 is not connected to the other conductors by means of a plug, because the associated spectral range is not to be evaluated during the comparison; for this purpose a pulse is generated by the pulse generator 20 of FIG. 1. As can be clearly seen, the pulse generator could also be omitted in this case if each of the sets 33 and 34 comprises a conductor which adjusts an extreme tolerance value, for example, zero or maximum value, so that a comparison would in any case produce a positive comparison result or signal.

Using the arrangement in accordance with the invention, amplitude/time functions which do not vary by more than the permitted tolerance from one signal value to the next are being considered as constant or stationary, although they may change monotonously with time in the same sense, i.e., a sufficiently slowly but steadily increasing or decreasing function is considered to be stationary. This is rather an advantage, notably in the case of speech signal analysis, because a change-over from one speech sound (e.g. a vowel) to the next is always accompanied by such strong variations of the function that they are always recognized as the end of the stationary condition, while within a speech sound always given small variations occur which have to be permitted.

Figure 2:
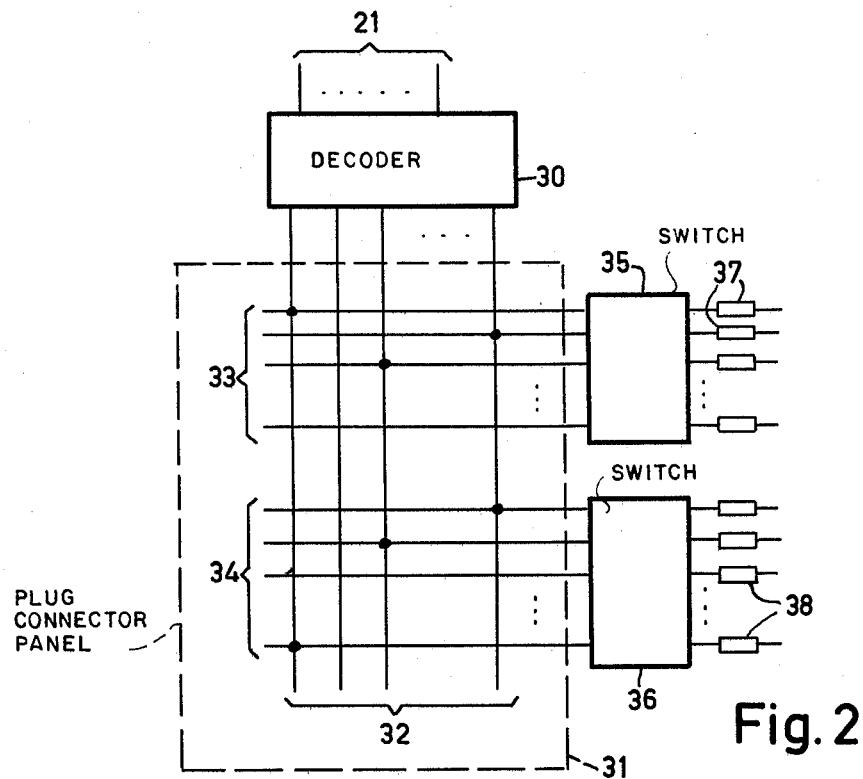
FIG. 2 shows an arrangement for generating different tolerance ranges for different spectral components.

In the digital histogram-forming device 9 in the arrangement of FIG. 1 a digital histogram is developed and stored in the way described. This apparatus is furthermore provided with a control input 9A and an information output 9B. When the histogram-forming is terminated, input 9A accommodates reception of a control signal whereupon the information stored in device 9 in parallel or serial form becomes available at output 9B in serial or parallel form for further processing for example in a computer. This further processing may comprise long-time storage if the histogram was formed as reference data regarding the sound source, for example the human speaker producing the input information to filter bank 1, or any other sound source to be recognized later. In a recognition operation the data of the histogram is transferred likewise to the computer for comparison with one or more respective stored source histograms. Upon identification or non-identification the computer provides an output signal identifying the recognized source's identity. Comparison operations are well known and, therefore, have not been described more extensively.

What is claimed is:

1. An arrangement for statistical signal analysis of an input analog signal having a plurality of spectral components, comprising:
    a filter bank having an input for receiving said analog signal, and an output, said filter bank producing the spectral components of said signal and supplying said components over said output;
    means having an input connected to said output of said filter bank, and an output, for storing said spectral components, said storing means generating a predetermined delay between the time of the reception of a signal value at said input of said storing means and the reproduction of the same signal value at said output of said storing means;
    comparison means having a first input connected to said output of said filter bank, and a second input connected to said output of said storing means, and an output, said comparison means comprising a comparator for simultaneously comparing the signal value of each spectral component from said first input at a first time with the signal value of the same spectral component from said second input at a second earlier time, an output signal being produced if the instantaneous signal value of at least a predetermined fraction of the spectral component compared deviates from the corresponding stored signal values by less than a predetermined tolerance range;
    a first counter connected to said output of said comparison means for accumulating the successive output signals of said comparison means, while after the comparison the absence of a signal from the comparison device causes the transfer of the position of the first counter; and
    histogram-forming means connected to the output of said first counter for separately counting the number of the transfer of each separate counter position of said first counter.

2. An arrangement as claimed in claim 1, wherein said comparison means further comprises a second counter connected to the output of said comparison means, said comparator successively comparing the signal values of the complete set of spectral components, the second counter having a counting input connected to an output of said comparator for counting the output signals thereof, said comparison means supplying an output signal if the position of said second counter exceeds a predetermined counting position after the comparison of the signal values of a complete set of spectral components, the second counter being subsequently reset to a starting position.

3. An arrangement as claimed in claim 2, further comprising a second comparator connected to the output of said second counter for comparing the counting position of said second counter with an adjustable counting position and supplying, in the case of correspondence, a signal which is applied to said output of the comparison device.

4. An arrangement as claimed in claim 2, further comprising a pulse generator for applying a signal to said second counter, so that the second counter is each time advanced by one position, independent of the comparison result for these spectral components.

5. An arrangement as claimed in claim 2, further comprising a parallel/serial converter having an input connected to the output of said filter bank, and an output, said converter cyclically applying the signal values of all spectral components successively to said store and said first input of said comparison device.

6. An arrangement as claimed in claim 5, wherein said store is a shift register, having an input and an output, which stores the signal values of a complete set of spectral components.

7. An arrangement as claimed in claim 6, further comprising an analog-to-digital converter having an input connected to the output of said parallel/serial converter, and an output connected to said shift register, which comprises a plurality of parallel binary positions for each spectral component, and a digital-to-analog converter having an input connected to said output of said shift register.

8. An arrangement as claimed in claim 2, wherein said comparison device comprises first and second operational amplifiers each having an inverting and non-inverting inputs connected as comparators, the first operational amplifier receiving on its inverting input, the instantaneous signal value and, on its non-inverting input the stored signal value multiplied by a function of the upper tolerance range, the second operational amplifier receiving, on its non-inverting input, the instantaneous signal value and, on its inverting input the stored signal value, multiplied by a function of the lower tolerance range, the outputs of said operational amplifiers being connected to said AND-element having an output connected to said second counter for supplying the counting signal thereto.

9. An arrangement as claimed in claim 8, wherein the signal value applied from the store to the comparison device exceeds the signal previously applied directly to the comparison device by a given factor.

10. An arrangement as claimed in claim 8, further comprising first and second multipliers connected to said first and second operational amplifiers respectively, said multipliers comprising voltage dividers, factors of said multipliers are adjustable for each of said spectral components.

11. An arrangement as claimed in claim 10, further comprising a plug connector panel comprising first and second mutually intersecting sets of conductors, each conductor of said first set being associated with a different one of said spectral components, a conductor carrying a signal if the signal value of the associated spectral component is compared, a first plurality of said second set of conductors each time activating a resistor which determines the upper tolerance range, while a second plurality of said second set of conductors each time activates a resistor which determines the lower tolerance range, each time a conductor of said first plurality is connectable to one conductor to each of said first and second plurality of conductors of said second set.

* * * * *